(12) United States Patent
Rossman

(10) Patent No.: US 6,843,858 B2
(45) Date of Patent: Jan. 18, 2005

(54) METHOD OF CLEANING A SEMICONDUCTOR PROCESSING CHAMBER

(75) Inventor: Kent Rossman, Orlando, FL (US)

(73) Assignee: Applied Materials, Inc., Santa Clara, CA (US)

( * ) Notice: Subject to any disclaimer, the term of this patent is extended or adjusted under 35 U.S.C. 154(b) by 485 days.

(21) Appl. No.: 10/115,830

(22) Filed: Apr. 2, 2002

(65) Prior Publication Data

US 2003/0183244 A1 Oct. 2, 2003

(51) Int. Cl.$^7$ ................................................ B08B 3/00
(52) U.S. Cl. ................. 134/30; 134/1.1; 134/22.1; 134/22.18; 134/26; 134/31; 134/902; 216/63; 216/64; 216/67; 216/68; 438/905
(58) Field of Search ............................. 134/1.1, 22.1, 134/22.18, 26, 30, 31, 902; 216/63, 64, 67, 68; 438/905

(56) References Cited

U.S. PATENT DOCUMENTS

| | | |
|---|---|---|
| 4,138,306 A | 2/1979 | Niwa |
| 4,563,367 A | 1/1986 | Sherman |
| 4,910,042 A | 3/1990 | Hokynar |
| 4,913,929 A | 4/1990 | Moslehi et al. |
| 4,988,644 A | 1/1991 | Jucha et al. |
| 5,000,113 A | 3/1991 | Wang et al. |
| 5,158,644 A | 10/1992 | Cheung et al. |
| 5,346,579 A | 9/1994 | Cook et al. |
| 5,350,480 A | 9/1994 | Gray |
| 5,403,434 A | 4/1995 | Moslehi |
| 5,662,770 A | 9/1997 | Donohoe |
| 5,688,357 A | 11/1997 | Hanawa |
| 5,770,098 A | 6/1998 | Araki et al. |
| 5,788,778 A | 8/1998 | Shang et al. |
| 5,792,272 A | 8/1998 | van Os et al. |
| 5,812,403 A | 9/1998 | Fong et al. |
| 5,843,239 A | 12/1998 | Shrotriya |
| 5,844,195 A | 12/1998 | Fairbairn et al. |
| 5,942,804 A | 8/1999 | Mohwinkel et al. |
| 6,020,035 A | 2/2000 | Gupta et al. |
| 6,039,834 A | 3/2000 | Tanaka et al. |
| 6,060,397 A | 5/2000 | Seamons et al. |
| 6,060,400 A | 5/2000 | Oehrlein et al. |
| 6,068,729 A | 5/2000 | Shrotriya |
| 6,079,426 A | 6/2000 | Subrahmanyam et al. |
| 6,109,206 A | 8/2000 | Maydan et al. |

(List continued on next page.)

FOREIGN PATENT DOCUMENTS

| | | |
|---|---|---|
| DE | 4132559 | 4/1993 |
| EP | 0537950 | 4/1993 |

(List continued on next page.)

OTHER PUBLICATIONS

Grill, Alfred, "Cold Plasma in Materials Fabrication", IEEE Press, 1994, pp. 109–110, 160–163.
U.S. Appl. No. 10/153,315, Hua et al.

Primary Examiner—M. Kornakov
(74) Attorney, Agent, or Firm—Townsend & Townsend & Crew

(57) ABSTRACT

A method of operating a substrate processing chamber. In one embodiment the method includes processing one or more substrates in the substrate processing chamber and subsequently cleaning the chamber using a dry cleaning process. This substrate processing and dry cleaning sequence is then repeated multiple times before chamber is further cleaned by flowing a cleaning gas into the chamber and forming a plasma within the chamber from the cleaning gas in an extended cleaning process. During the extended cleaning process the plasma is maintained within the chamber for a total of at least 5 minutes before the chamber is reused to process a substrate.

31 Claims, 3 Drawing Sheets

| U.S. PATENT DOCUMENTS | | | | FOREIGN PATENT DOCUMENTS | | |
|---|---|---|---|---|---|---|
| 6,125,859 A | 10/2000 | Kao et al. | | EP | 0552491 | 7/1993 |
| 6,148,832 A | 11/2000 | Gilmer et al. | | EP | 0697467 | 2/1996 |
| 6,170,428 B1 | 1/2001 | Redeker et al. | | JP | 1-220434 | 9/1989 |
| 6,182,602 B1 | 2/2001 | Redeker et al. | | JP | 2-125876 | 5/1990 |
| 6,217,951 B1 | 4/2001 | Mizuno et al. | | WO | 97/03223 | 1/1997 |
| 6,329,297 B1 | 12/2001 | Balish et al. | | WO | 99/02754 | 1/1999 |
| 6,387,207 B1 | 5/2002 | Janakiraman et al. | | WO | 99/03312 | 1/1999 |

METHOD OF CLEANING A SEMICONDUCTOR PROCESSING CHAMBER

BACKGROUND OF THE INVENTION

The present invention relates to the fabrication of integrated circuits. More specifically, embodiments of the invention pertain to methods of removing residue from the interior surfaces of a substrate processing chamber.

One of the primary steps in the fabrication of modern semiconductor devices is the formation of a layer, such as a silicon oxide layer, on a substrate or wafer. As is well known, such a layer can be deposited by chemical vapor deposition (CVD). In a conventional thermal CVD process, reactive gases are supplied to the substrate surface where heat-induced chemical reactions take place to form the desired film. In a conventional plasma CVD process, a controlled plasma is formed using radio frequency (RF) energy or microwave energy to decompose and/or energize reactive species in reactant gases to produce the desired film.

Unwanted deposition on areas such as the walls of the processing chamber also occurs during such CVD processes. As is known in the industry, it is common to remove the unwanted deposition material that builds up on the interior of chamber walls with an in situ chamber clean operation. Common chamber cleaning techniques include the use of an etchant gas, such as fluorine, to remove the deposited material from the chamber walls and other areas. In some processes, the etchant gas is introduced into the chamber and a plasma is formed within the chamber so that the etchant gas reacts with and removes the deposited material from the chamber walls. Such cleaning procedures are commonly performed between deposition steps for every wafer or every n wafers.

Some semiconductor manufactures employ a remote plasma cleaning process as an alternative to an in situ plasma cleaning, a remote plasma cleaning procedure may be employed in which a plasma is generated remote from the substrate processing chamber by a high density plasma source such as a microwave plasma system, toroidal plasma generator or similar device. Dissociated species from the plasma are then transported to the substrate processing chamber where they can react with and etch away the undesired deposition build-up. Remote microwave plasma cleaning procedures are sometimes used by manufacturers because they provide a "softer" etch than in situ plasma clean operations, i.e., there is less ion bombardment and/or physical damage to chamber components because the plasma is not in contact with chamber components.

Regardless of whether an in situ or remote cleaning process is employed, over time, residue may build up within the chamber that cannot be removed by standard dry cleaning processes. Accordingly, many semiconductor manufacturers use a wet cleaning process to remove such residue. One commonly used wet clean process includes removing appropriate components of the chamber (e.g., chamber liners, the gas manifold or gas nozzles, and the pedestal) and dipping the components in a bath of hydrofluoric acid (HF). Components that cannot easily be dipped in such a bath, e.g., the interior chamber walls, are instead wiped with an HF or similar solution.

As can be appreciated, wet cleaning operations require the substrate processing tool to be taken offline. This results in a decrease in wafer throughput and a general desire on behalf of the semiconductor manufacturers to use such wet cleaning processes less frequently than dry cleaning processes. As an example of frequency of use, during the use of one known semiconductor substrate processing tool used to deposit a silicon oxide dielectric layer over a substrate, the chamber is dry cleaned using a remote plasma clean process after every 5th substrate processed in the chamber, while the chamber is cleaned using a wet clean process every 5000 wafers.

While wet clean processes such as the HF clean just described have been used successfully by a number of different semiconductor manufacturers, improved cleaning processes are desirable.

SUMMARY OF THE INVENTION

Embodiments of the present invention pertain to a cleaning process that is used to remove residue remaining within a substrate processing chamber after processing a substantial number of wafers in the chamber and after performing a number of dry cleaning processes.

According to one embodiment of the invention, one or more substrates are processed in a substrate processing chamber and the chamber is subsequently cleaned using a dry cleaning process. This substrate processing and dry cleaning sequence is then repeated multiple times before the chamber is further cleaned using an extended cleaning process in which a plasma is formed within the chamber and maintained for at least 5 minutes from an appropriate cleaning gas. In one embodiment, the cleaning gas includes a hydrogen source and a fluorine source. In another embodiment the cleaning gas further includes an oxygen source. In still another embodiment the cleaning gas consists of argon. And in still another embodiment cleaning gas consists of argon and a hydrogen source.

These and other embodiments of the invention along with many of its advantages and features are described in more detail in conjunction with the text below and attached figures.

DESCRIPTION OF THE SPECIFIC EMBODIMENTS

As described above, embodiments of the invention provide a method of removing the residue from a substrate processing chamber that builds up and remains after multiple cycles of substrate processing operations and chamber dry cleaning operations. As used herein a chamber "dry cleaning" operation is any process intended to remove residue from an interior surface of the chamber in the gas phase as opposed to liquid phase. The removal of contaminants in a dry cleaning process is driven by either conversion of the contaminant into a volatile compound through a chemical reaction, by knocking the contaminant off the interior surface via a momentum transfer or by lifting the contaminant off the surface during etching of the surface.

Dry cleaning operations include both in situ and remote plasma cleaning processes as well as thermal gas phase cleaning processes and others. Embodiments of the invention are particularly useful in removing residue build-up from a chemical vapor deposition (CVD) chamber but may also be used to remove residue and other potential sources of contamination from other types of deposition chambers, e.g., physical vapor deposition (PVD) chambers, etching chambers and other types of substrate processing chambers in which a plasma can be formed within the chamber.

Figure 1:
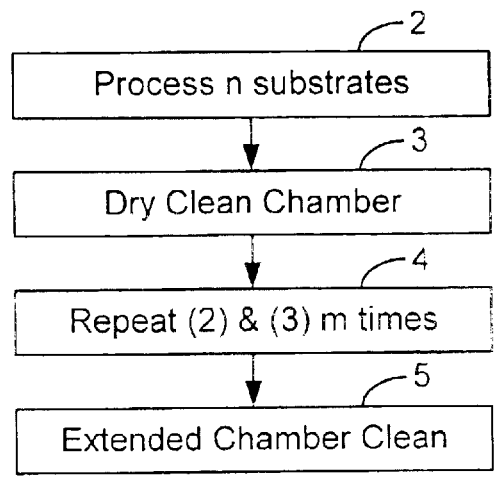
FIG. 1 is a flowchart illustrating the steps according to one embodiment of the present invention.

FIG. 1 is a flowchart illustrating the steps according to one embodiment of the present invention. In the embodiment shown in FIG. 1, the process begins by sequentially processing n wafers in a substrate processing chamber according to a desired process or recipe (step 2). In one embodiment the process or recipe is a CVD film deposition step, but in other embodiments the process or recipe in step 2 may be a PVD film deposition step, a film etch step or another appropriate substrate processing operation. The number of wafers, n, processed in step 2 before the dry cleaning operation of step 3 depends on the type of process employed in step 2 and the thickness of film deposited or amount of film etched. In some embodiments, n is between 1 and 25 but the invention is not limited to any particular value of n.

After n wafers have been processed, the substrate processing chamber is then cleaned using an appropriate dry cleaning process to remove residue that may have accumulated on various interior surfaces of the chamber (step 3). The type of dry cleaning process used, as well as its frequency, depends on the type of substrate processing operation employed in step 2. If, for example, step 2 deposits a silica glass layer over each substrate, dry cleaning operation 3 may form a plasma from a fluorocarbon or similar gas in order to remove silica glass deposited over the interior walls of the chamber.

Steps 2 and 3 are then repeated a number of times, m, (step 4) until the chamber is ready for an extended cleaning process according to embodiments of the present invention. While the invention is not limited to any particular value of m, typically, the number of wafers processed in step 2 prior to step 5 being run on a chamber (n×m) is in the range of 500 to 10,000 wafers. Thus, in one embodiment where n equals 5, m equals 100–2000. And in one embodiment where n equals 1, m is between 500–10,000.

Extended clean step 5 is fundamentally different than dry cleaning step 3 in that it is designed to remove residue and contaminants that are not completely removed in step 2. To this end, extended clean step 5 forms an in situ plasma that is maintained within the chamber for a longer period of time than is practical, e.g., because of throughput concerns, for dry cleaning step 2. In one embodiment the plasma is also formed using relatively high RF power levels. This, combined with the length of time the plasma is maintained within the chamber, results in the plasma heating the interior surfaces of the chamber to temperatures that are often above the temperatures the same surfaces are heated to during dry cleaning step 2. In other embodiments an increased cleaning temperature is obtained by actively heating the chamber and/or selected components of the chamber, with an appropriate heater.

In some embodiments, a plasma is maintained within the substrate processing chamber for at least 5 minutes and in other embodiment for at least 10 minutes. In one specific embodiment the plasma is maintained for between 10–30 minutes. In contrast, the cleaning plasma in dry cleaning step 2 is typically maintained for less than 5 minutes and is maintained for between 1–4 minutes in some embodiments.

Various cleaning gases can be used in extended clean step 5. In some embodiments the cleaning gas includes a hydrogen source and one or more of a fluorine source or argon. The hydrogen source can be $H_2$, $SiH_4$, air ($N_2/O_2/H_2O$) or other similar sources. Other gases can be added or removed from the cleaning gas depending on the type of residue that accumulates and remains within the chamber over time after repeated iterations of steps 2 and 3. For example, if a carbon residue accumulates during the extended operation of the chamber, an oxygen source may be added (e.g., $O_2$) to help remove the carbon. If fluorine accumulates within the chamber, however, (e.g., in the form of $AlF_x$), a fluorine source may not be necessary as the accumulated fluorine will be available to react with the plasma.

As previously mentioned, dry cleaning step 2 may or may not form an in situ plasma within the chamber. Even in instances where cleaning step 2 employs an in situ plasma, the plasma formed in extended cleaning step 5 is typically different from the step 2 plasma in either or, more typically, both gases and power levels employed. As used herein, using different cleaning gases in steps 2 and 5 refers to the clean gases used in steps 2 and 5 having at least one different precursor gas. It does not mean the steps cannot have any gases in common. For example, in one embodiment employing "different" cleaning gases in steps 2 and 5, cleaning step 2 employs a clean gas of $NF_3$ and Ar while the cleaning gas used in step 5 includes $NF_3$, Ar and $H_2$.

In order to better appreciate and understand the present invention, the invention is illustrated below with reference to a specific example in which a high density plasma CVD (HDP-CVD) chamber is used to deposit undoped silicate glass (USG) layers over a semiconductor substrate. This example is for illustrative purposes only as the present invention can be used to remove residue from other types of substrate processing chambers and from chambers used to deposit materials other than silicate glass, among other possible uses. The example includes some details that are, in part, chamber specific. Thus, before describing the examples, a brief description of the HDP-CVD substrate processing chamber is given.

Figure 2A:
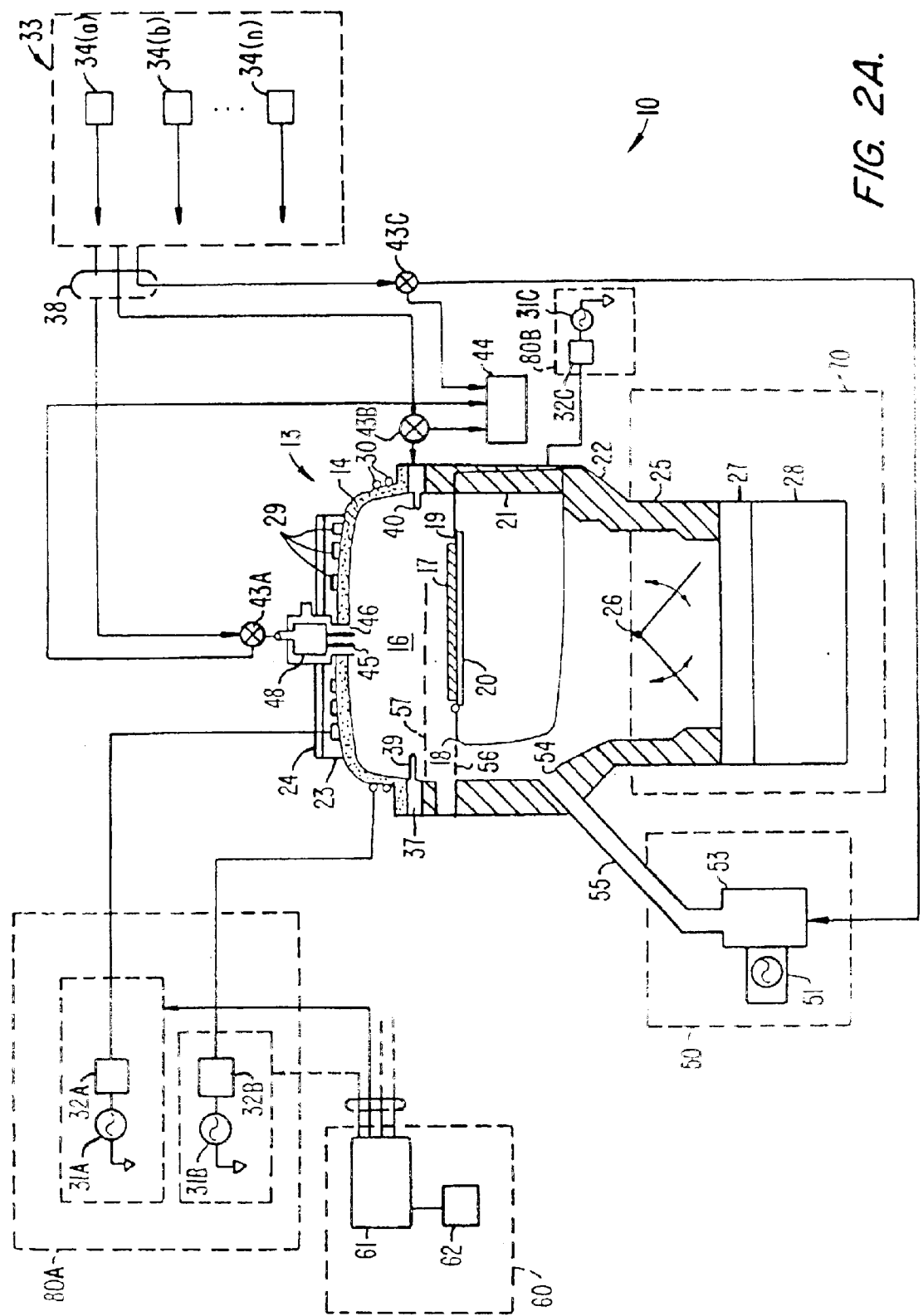
FIG. 2A is a simplified, cross-sectional view of an exemplary substrate processing system with which embodiments of the present invention may be used.

FIG. 2A illustrates one embodiment of a high density plasma chemical vapor deposition (HDP-CVD) system 10 in which the method of the present invention may be practiced. System 10 includes a chamber 13, a substrate support 18, a gas delivery system 33, a remote plasma cleaning system 50, a vacuum system 70, a source plasma system 80A, a bias plasma system 80B.

The upper portion of chamber 13 includes a dome 14, which is made of a ceramic dielectric material, such as aluminum oxide or aluminum nitride. Dome 14 defines an upper boundary of a plasma processing region 16. Plasma processing region 16 is bounded on the bottom by the upper surface of a substrate 17 and a substrate support 18, which is also made from an aluminum oxide or aluminum ceramic material.

A heater plate 23 and a cold plate 24 surmount, and are thermally coupled to, dome 14. Heater plate 23 and cold plate 24 allow control of the dome temperature to within about ±10° C. over a range of about 100° C. to 200° C.

Generally, exposure to the plasma heats a substrate positioned on substrate support 18. Substrate support 18 includes inner and outer passages (not shown) that can deliver a heat transfer gas (sometimes referred to as a backside cooling gas) to the backside of the substrate.

The lower portion of chamber 13 includes a body member 22, which joins the chamber to the vacuum system. A base portion 21 of substrate support 18 is mounted on, and forms a continuous inner surface with, body member 22. Substrates are transferred into and out of chamber 13 by a robot blade (not shown) through an insertion/removal opening (not shown) in the side of chamber 13. Lift pins (not shown) are raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 includes an electrostatic chuck 20 that can be used to secure the substrate to substrate support 18 during substrate processing.

Vacuum system 70 includes throttle body 25, which houses twin-blade throttle valve 26 and is attached to gate valve 27 and turbo-molecular pump 28. Gate valve 27 can isolate pump 28 from throttle body 25, and can also control chamber pressure by restricting the exhaust flow capacity when throttle valve 26 is fully open. The arrangement of the throttle valve, gate valve, and turbo-molecular pump allow accurate and stable control of chamber pressures as low as about 1 mTorr.

Source plasma system 80A is coupled to a top coil 29 and side coil 30, mounted on dome 14. A symmetrical ground shield (not shown) reduces electrical coupling between the coils. Top coil 29 is powered by top source RF (SRF) generator 31A, whereas side coil 30 is powered by side SRF generator 31B, allowing independent power levels and frequencies of operation for each coil. In a specific embodiment, the top source RF generator 31A provides up to 2,500 watts of RF power at nominally 2 MHz and the side source RF generator 31B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 80B includes a bias RF (BRF) generator 31C and a bias matching network 32C. The bias plasma system 80B capacitively couples substrate portion 17 to body member 22, which act as complimentary electrodes. The bias plasma system 80B serves to enhance the transport of plasma species (e.g., ions) created by the source plasma system 80A to the surface of the substrate. In a specific embodiment, bias RF generator provides up to 5,000 watts of RF power at 13.56 MHz.

RF generators 31A and 31B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 32A and 32B match the output impedance of generators 31A and 31B with their respective coils 29 and 30. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 33 provides gases from several sources 34(a) . . . 34(n) via gas delivery lines 38 (only some of which are shown). In the particular example illustrated below, gas sources 34(a) . . . 34(n) include separate sources for $SiH_4$, $O_2$, Ar and $NF_3$ as well as one or more sources for the extended cleaning process. As would be understood by a person of skill in the art, the actual sources used for sources 34(a) . . . 34(n) and the actual connection of delivery lines 38 to chamber 13 varies depending on the deposition and cleaning processes executed within chamber 13. Gas flow from each source 34(a) . . . 34(n) is controlled by one or more mass flow controllers (not shown) as is known to those of skill in the art.

Figure 2B:
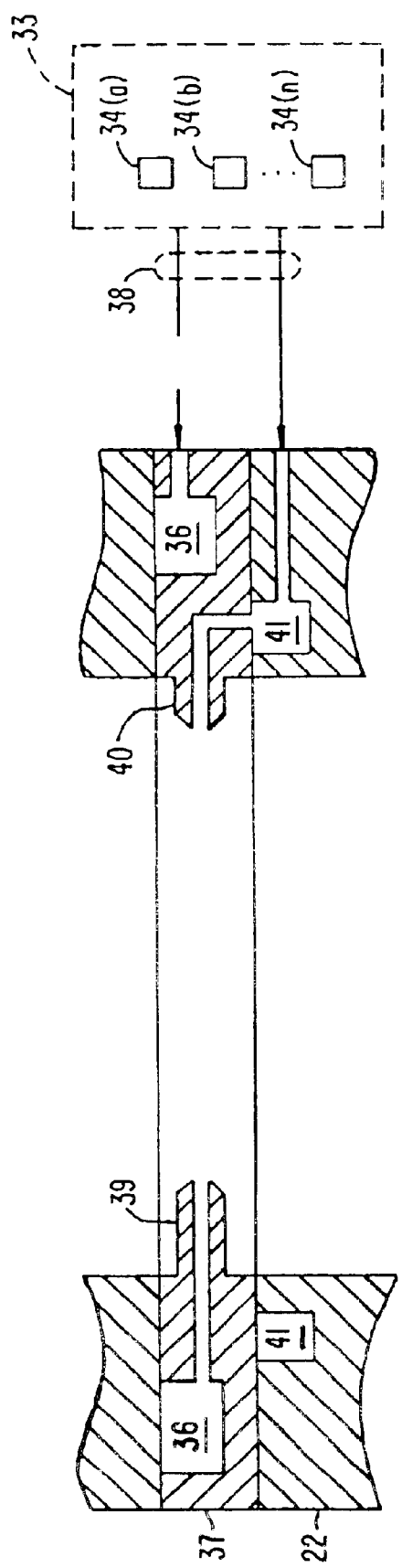
FIG. 2B is a simplified cross-sectional view of a gas ring that may be used in conjunction with the exemplary CVD processing chamber of FIG. 2A.

Gases are introduced into chamber 13 through a gas ring 37 and/or a top nozzle 45. FIG. 2B is a simplified, partial cross-sectional view of chamber 13 showing additional details of gas ring 37. In some embodiments, one or more gas sources provide gas to ring plenum 36 in gas ring 37 via gas delivery lines 38 (only some of which are shown). Gas ring 37 has a plurality of gas nozzles 39 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 37 has 12 gas nozzles 39 made from an aluminum oxide ceramic.

Gas ring 37 also has a plurality of gas nozzles 40 (only one of which is shown), which in a specific embodiment are co-planar with and shorter than source gas nozzles 39, and in one embodiment receive gas from body plenum 41. Gas nozzles 39 and 40 are not fluidly coupled in some embodiments where it is desirable to not mix gases (e.g., $SiH_4$ and $O_2$) introduced through gas ring 37 before injecting the gases into chamber 13. In other embodiments, gases may be mixed prior to injecting the gases into chamber 13 by providing apertures (not shown) between body plenum 41 and gas ring plenum 36. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 43B, to isolate chamber 13 from a delivery line 38 and to vent delivery line 38 to vacuum foreline 44, for example. As shown in FIG. 2A, other similar valves, such as 43A and 43C, may be incorporated on other gas delivery lines. Such 3-way valves may be placed as close to chamber 13 and remote plasma source 50 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 2A, chamber 13 also has top nozzle 45 and top vent 46. Top nozzle 45 and top vent 46 allow independent control of top and side flows of the gases, which improves film uniformity and allows fine adjustment of the film's deposition and doping parameters. Top vent 46 is an annular opening around top nozzle 45. In one embodiment, one source, e.g., $SiH_4$, supplies source gas nozzles 39 and top nozzle 45 through separate MFCs (not shown). Similarly, separate MFCs may be used to control the flow of oxygen to both top vent 46 and gas nozzles 40 from a single source of oxygen. The gases supplied to top nozzle 45 and top vent 46 may be kept separate prior to flowing the gases into chamber 13, or the gases may be mixed in top plenum 48 before they flow into chamber 13.

In other embodiments, separate sources of the same gas may be used to supply various portions of the chamber.

A remote microwave-generated plasma cleaning system 50 is provided to periodically clean deposition residues from chamber components in a dry cleaning operation. The cleaning system includes a remote microwave generator 51 that creates a plasma from one or more cleaning gas source in sources 34(a) . . . 34(n) (e.g., molecular fluorine, nitrogen trifluoride, other fluorocarbons or equivalents alone or in combination with another gas such as Argon) in reactor cavity 53. The reactive species resulting from this plasma are conveyed to chamber 13 through cleaning gas feed port 54 via applicator tube 55. The materials used to contain the cleaning plasma (e.g., cavity 53 and applicator tube 55) must be resistant to attack by the plasma. The distance between reactor cavity 53 and feed port 54 should be kept as short as practical, since the concentration of desirable plasma species may decline with distance from reactor cavity 53. Generating the cleaning plasma in a remote cavity allows the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 controls the operation of system 10. Controller 60 may include, for example, a memory 62, such as a hard disk drive and/or a floppy disk drive and a card rack coupled to a processor 61. The card rack may contain a single-board computer (SBC), analog and digital input/output boards, interface boards and stepper motor controller boards. System controller 60 operates under the control of a computer program stored on the hard disk drive or through other computer programs, such as programs stored on a removable disk. The computer program dictates, for example, the timing, mixture of gases, RF power levels and other parameters of a particular process.

Figure 3:
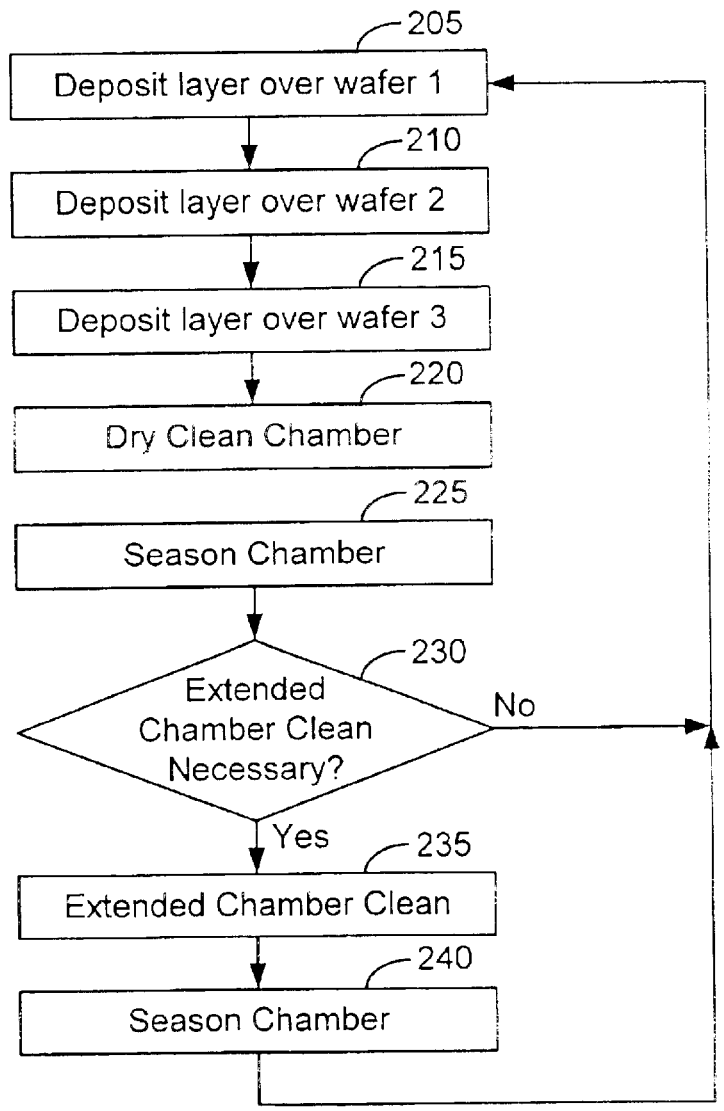
FIG. 3 is a flowchart illustrating the steps according to another embodiment of the present invention.

FIG. 3 is a flowchart illustrating the operation of chamber 13 according to an exemplary embodiment of the invention implemented in an Ultima™ HDP-CVD chamber manufactured by Applied Materials. The process shown in FIG. 3 is an extended wafer run in which an 8,000 Å layer of undoped silicate glass (USG) is deposited over multiple semiconductor substrates upon which partially completed integrated circuits are formed. As shown in FIG. 3, the exemplary extended wafer run includes performing a chamber dry cleaning process (step 220) and a chamber seasoning process (deposition of a thin silicon oxide layer over the interior surfaces of the chamber prior to the next deposition step 205) (step 225) after every three substrates that are processed in chamber 13 to form 8,000 Å USG layers over the substrates (steps 205, 210, 215). Table 1 below illustrates key parameters of the process used to deposit the 8,000 Å USG layers as well as the key parameters in the chamber dry cleaning process and chamber seasoning operation. Gas flow values in Table 1 that include two numbers separated by a "+" sign indicate the flow rate through side and top nozzles, respectively, of chamber 13. Also, a pressure level of "TVO" indicates that the throttle valve is fully open setting the chamber pressure to a minimum value (typically in the 1–3 mTorr range) that is determined by the flow rate of the gases introduced into the chamber. As can be seen from Table 1, each of 8,000 Å USG deposition steps 205, 210, 215 takes approximately 90 seconds while cleaning step 220 takes approximately 180 seconds and seasoning step 225 takes approximately 10 seconds. Various set-up and purge steps may also be included before and after each of steps 205–225

TABLE 1

| PARAMETER | USG DEP STEPS 205, 210, 215 | CHAMBER CLEAN STEP 220 | CHAMBER SEASONING STEP 225 |
|---|---|---|---|
| $SiH_4$ | 74 + 12.4 sccm | — | 85 sccm |
| $O_2$ | 156 sccm | — | 130 sccm |
| Ar | 110 + 16 sccm | — | 95 + 15 sccm |
| $NF_3$-MW | — | 1500 sccm | — |
| Pressure | TVO | 3000 mTorr | TVO |
| Top RF (2 MHz) | 1300 W | — | 1300 W |
| Side RF (2 MHz) | 3100 W | — | 3100 W |
| Bias RF (13.56 MHz) | 3500 W | — | 0 W |
| MW Power | — | 3200 W | — |
| Time | 90 secs | 180 secs | 10 secs |

From previous extended wafer run experiments, the inventors have found that the deposition, chamber clean sequence illustrated in FIG. 2 can be used to process thousands of wafers before an aluminum fluoride residue containing traces of carbon, nitrogen, titanium and other elements accumulates to levels that may adversely affect further substrate processing. This undesirable residue that forms on various chamber components can be cleaned using wet cleaning techniques such as those described above or the components may be replaced altogether.

The inventors have determined, however, that such wet cleaning techniques can be replaced with an in situ chamber cleaning process in which a plasma is formed within chamber 13 for an extended period of time. This in situ extended chamber cleaning process is shown in FIG. 3 as step 235 which is typically only executed after some relatively large number of substrates are processed in chamber 13 in multiple iterations of the step 205–225 sequence. The inventors have found that for the above USG deposition process and associated clean and seasoning process an extended wafer run of at least 500–2000 wafers can be processed in the step 205–225 sequence before extended cleaning step 235 is executed. In one embodiment, a counter m is used to count the number of wafers processed and step 235 is executed once m reaches the predetermined frequency for the extended clean (step 230). In other embodiments, sensors are used to monitor contaminant levels within chamber 13 and only when the sensors indicate that contaminant levels have reached a certain level is extended clean step 235 executed. After performing extended clean step 235, chamber 13 is seasoned (step 240) and the chamber is ready for additional deposition steps.

In one embodiment the extended chamber clean process forms an in situ plasma from a cleaning gas that includes a hydrogen source and argon. The hydrogen source may be H₂ or air (N₂/O₂/H₂O). Argon, which is a highly dissociative atom, allows the plasma to be sustained at a very low pressure (e.g., between 0.5–120 mTorr and preferably between 0.5 and 30 mTorr in some embodiments and between 0.5–5 mTorr in other embodiments). The in situ plasma is allowed to clean the chamber for at least 5 minutes and more typically for between 10–30 minutes at relatively high RF power levels (e.g., 2500–5000 W for the side coil and 1500–5000 W for the top coil). In one embodiment, RF bias power is not employed. During this time, the source (top and side) RF power levels are left ON.

Because the in situ plasma formed by this process is maintained for such an extended period at such low pressure levels, the plasma heats the chamber to temperatures that typically are not reached during a standard dry cleaning operation such as that of steps 220. For example, the temperature of dome 14, which is actively cooled by cold plate 24 during the extended cleaning process so that the dome does not crack from the high temperatures, may reach a temperature of between 180–300° C. in some embodiments and more typically between 200–250° C. in other embodiments.

In contrast, the temperature of dome 14 during deposition, cleaning and seasoning steps 205–225, is typically controlled by cold plate 24 at a temperature of about 120° C. Also, gas flows used to clean a high density plasma chamber, such as chamber 13, during dry cleaning step 220 are typically above 60 mTorr due to the relatively high flow rate of the fluorine source (e.g., greater than 500 sccm of NF₃) employed to etch the relatively large quantities of silicon oxide that have accumulated over the chamber surfaces between dry cleaning processes.

In embodiments where there is no fluorine source used in extended clean step 230, the RF power levels used are maximized in order to intentionally sputter the contaminated chamber dome surfaces and heat the dome to desorb the contaminants. In contrast, the inclusion of a fluorine source in dry cleaning step 220 typically limits the RF power levels employed during the dry cleaning step. If RF power levels are not limited during such a fluorine-containing clean step, the higher dome temperatures may result in the formation of AlF on the dome surface thereby consuming an outer layer of the ceramic dome and reducing its lifetime.

In some embodiments where air is used as one of the gases in the extended chamber cleaning process, it is possible to open a valve in the chamber to let the air in rather than supply air from a dedicated source of clean dry air (CDA). For example, a number of plasma processing chambers such as chamber 13 include a residual gas analyzer (RGA) tap area near the foreline for a particle monitor or similar device. In such chambers, opening the valve in the RGA tap area may serve as the source for the air.

In another embodiment of the invention, the in situ plasma formed within the chamber during extended clean step 235 is formed from only argon In one embodiment, the flow of argon is between 5–100 sccm. In one particular embodiment, an argon flow of 15 sccm was introduced into the chamber and a plasma was formed by applying 4800 W of RF power to the top coil and 1200 W of RF power to the side coil. Chamber pressure was set to 1.2 mTorr and the plasma was maintained for 30 minutes. During this extended clean process, the dome temperature was reached a temperature of 210° C. and was sustained at that temperature throughout the extended clean.

In order to test the effectiveness of this argon-only embodiment, the inventor implemented the process in a HDP-CVD tool (Ultima™ chamber manufactured by Applied Materials) where contaminate levels within the chamber due to an extended sequence of film deposition and chamber clean steps resulted in an unacceptably high number of particles (greater than 50 per wafer) greater than 0.2 microns in diameter being added to subsequent deposition processes. Before the argon-only extended clean step was implemented, many of the interior ceramic surfaces of the chamber including the chamber dome, nozzles and process kit included dark blackish/brown spots indicative of high contaminant levels. While not being limited to any particular theory, it is believed that areas of contaminants form a relatively poor interface with silica glass films and thus lead to particles due to flaking and/or delamination of silica glass formed over the surfaces. After running the above argon-only extended clean step, all the interior surfaces of the chamber including the ceramic surfaces mentioned above were clean with no signs of contamination. Also, particle levels for subsequent substrate deposition steps performed in the chamber showed particles levels that were returned to the acceptable, production level requirement (for the particular deposition application) of less than 50 particles of 0.2 micron in diameter or more per wafer.

Having fully described several embodiments of the present invention, many other equivalents or alternative embodiments of the present invention will be apparent to those skilled in the art. These equivalents and/or alternatives are intended to be included within the scope of the present invention.

What is claimed is:

1. A method of operating a substrate processing chamber, said method comprising:
   (a) processing one or more substrates in said substrate processing chamber;
   (b) cleaning said chamber using a dry cleaning process;
   (c) repeating steps (a) and (b) one or more times; and
   (d) thereafter, performing an extended cleaning process by flowing a cleaning gas into said chamber and forming a plasma within said chamber from said cleaning gas, wherein said plasma is maintained for a total of at least 5 minutes before said chamber is reused to process a substrate.

2. The method of claim 1 wherein said cleaning gas comprises a hydrogen source and a fluorine source.

3. The method of claim 2 wherein said cleaning gas further comprises an oxygen source.

4. The method of claim 2 wherein said fluorine source is NF₃.

5. The method of claim 1 wherein said cleaning gas consists of argon.

6. The method of claim 1 wherein said cleaning gas consists of argon and a hydrogen source.

7. The method of claim 6 wherein said hydrogen source is H₂.

8. The method of claim 6 wherein said plasma is formed at a pressure between 0.5 and 120 mTorr.

9. The method of claim 6 wherein said plasma is formed at a pressure between 0.5 and 5 mTorr.

10. The method of claim 1 wherein a plasma is maintained in said substrate processing chamber for between a total of between 10 to 30 minutes during said extended cleaning step.

11. The method of claim 10 wherein a cleaning plasma is maintained for less then 5 minutes during said dry cleaning process.

12. The method of claim 1 wherein said cleaning gas is different in composition from a gas used during said dry cleaning process.

13. A method of operating a substrate processing chamber, said method comprising:
(a) transferring a substrate into said substrate processing chamber having at least one interior chamber surface;
(b) depositing a layer of material over said substrate, wherein said depositing step also results in unwanted deposition of material on said interior chamber surface;
(c) transferring said substrate out of said substrate processing chamber;
(d) optionally, repeating (a)–(c) n times, where n is an integer between 1 and 25;
(e) thereafter, removing said unwanted deposition build-up from said interior chamber surface by exposing said surface to reactive species from a first cleaning gas;
(f) repeating (a)–(e) m times, where m is an integer greater than 25, wherein after (a)–(e) are repeated m times, unwanted residue has built up on said interior chamber surface;
(g) thereafter, performing an extended cleaning process to remove said unwanted residue from said interior chamber surface by forming a plasma within said chamber from a second cleaning gas, wherein said second cleaning gas is different in composition from said first cleaning gas.

14. The method of claim 13 wherein said first cleaning gas comprises a fluorine source.

15. The method of claim 14 wherein said second cleaning gas comprises hydrogen and argon.

16. The method of claim 15 wherein said second cleaning gas further comprises an oxygen source.

17. The method of claim 15 wherein said second cleaning gas further comprises a fluorine source.

18. The method of claim 14 wherein said second cleaning gas consists of argon.

19. The method of claim 14 wherein said second cleaning gas consists of hydrogen and argon.

20. The method of claim 13 wherein said extended cleaning process forms a plasma within said chamber for at least 5 minutes.

21. The method of claim 13 wherein said extended cleaning process forms a plasma within said chamber for at least 10 minutes.

22. The method of claim 20 wherein said interior chamber surface is exposed to reactive species during step (e) for less than 5 minutes.

23. A method of operating a high density plasma chemical vapor deposition chamber having a plasma generation system that includes a coil, said method comprising:
(a) transferring a substrate into said chamber, depositing a layer of silica glass over said substrate and transferring said substrate out of said chamber, wherein when said silica glass is deposited over said substrate some deposition also occurs on an interior surface of said chamber;
(b) optionally, repeating (a) n times, where n is an integer between 1 and 10;
(c) thereafter, removing said deposition from said interior surface by exposing said surface to reactive species from a first cleaning gas;
(d) repeating (a)–(c) m times, where m is an integer greater than 100;
(e) thereafter, performing an extended cleaning process by flowing a second cleaning gas into said chamber and applying RF energy to said coil to form a plasma within said chamber from said second cleaning gas, wherein said second cleaning gas is different in composition from said first cleaning gas.

24. The method of claim 23 wherein said second cleaning gas comprises a hydrogen source.

25. The method of claim 24 wherein said second cleaning gas further comprises a fluorine source.

26. The method of claim 25 wherein said second cleaning gas further comprises argon.

27. The method of claim 24 wherein said hydrogen source is selected from the group consisting of: air, silane and molecular hydrogen.

28. The method of claim 23 wherein said second cleaning gas consists of argon.

29. The method of claim 23 wherein said extended cleaning process forms a plasma within said chamber for at least 5 minutes.

30. The method of claim 23 wherein said extended cleaning process forms a plasma within said chamber for at least 10 minutes.

31. The method of claim 30 wherein said interior chamber surface is exposed to reactive species during step (e) for less than 5 minutes.

* * * * *